(12) United States Patent
Yamada

(10) Patent No.: US 8,363,751 B2
(45) Date of Patent: Jan. 29, 2013

(54) COMMUNICATION METHOD AND COMMUNICATION SYSTEM

(75) Inventor: Hideaki Yamada, Shimo-suwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 257 days.

(21) Appl. No.: 12/756,888

(22) Filed: Apr. 8, 2010

(65) Prior Publication Data

US 2010/0260274 A1 Oct. 14, 2010

(30) Foreign Application Priority Data

Apr. 9, 2009 (JP) ................................ 2009-094645

(51) Int. Cl.
*H04K 1/02* (2006.01)
*H04L 25/49* (2006.01)

(52) U.S. Cl. ......................... 375/296; 375/298; 375/299

(58) Field of Classification Search .................. 375/295, 375/296, 373, 376, 253, 254
See application file for complete search history.

(56) References Cited

U.S. PATENT DOCUMENTS

| 5,802,123 A * | 9/1998 | Yoshimura et al. ........... 375/376 |
| 5,835,544 A * | 11/1998 | Yoshimura et al. ........... 375/376 |
| 6,947,493 B2 * | 9/2005 | Cohen et al. .................. 375/295 |
| 7,010,056 B1 * | 3/2006 | McCorkle et al. ............ 375/295 |
| 7,167,527 B1 * | 1/2007 | Park et al. ..................... 375/295 |
| 7,787,355 B2 * | 8/2010 | van Nee ........................ 370/203 |
| 7,800,518 B2 * | 9/2010 | Miwa .............................. 341/53 |
| 2006/0193372 A1* | 8/2006 | McCorkle et al. ............ 375/130 |
| 2008/0181315 A1* | 7/2008 | Wang et al. ................... 375/257 |

FOREIGN PATENT DOCUMENTS

JP 08-154053 A 6/1996

* cited by examiner

*Primary Examiner* — David Ometz
*Assistant Examiner* — Qutbuddin Ghulamali
(74) *Attorney, Agent, or Firm* — Kilpatrick Townsend & Stockton LLP

(57) ABSTRACT

A communication method includes: (a) dividing one bit data group into a plurality of bit groups, the one bit data group being taken out from a plurality of bit data groups defined by a communication protocol for transmitting predetermined information, and exerting no substantial influence on the predetermined information even when arbitrarily inverting a value of the bit; (b) determining whether or not the values of the bits constituting the bit group are all the same by each of the plurality of bit groups divided into in step (a); (c) inverting at least one of the values of the bits of the bit group determined in step (b) that the values of the bits are all the same; and (d) arranging the plurality of bit groups, each of which has at least one of the values of the bits inverted in step (c), in the plurality of bit data groups except the one bit data group at regular intervals.

11 Claims, 4 Drawing Sheets

COMMUNICATION METHOD AND COMMUNICATION SYSTEM

BACKGROUND

1. Technical Field

The present invention relates to a communication method and a communication system performing communication according to a protocol.

2. Related Art

When recording or transmitting digital data, it is necessary to perform signal conversion (modulation) on the digital data so as to have an appropriate data structure, which can be realized by, for example, providing binary data composed of "0" and "1" corresponding to each of the level of the amplitude, the level of the frequency, the phase angle, the flux direction, and so on. In this case, Non Return to Zero (NRZ) continuously reflecting them in the signal state, and NRZ Inversion (NRZI) keeps the state of "0" after generating a pulse corresponding to "1." It should be noted that since these signals do not include a timing clock for determining "0" or "1," it is required to separately prepare a clock signal for synchronization. As a method for such synchronization, there have been known two methods described below.

One is an NRZI method of adding a clock pulse to every bit. Since in this case two pulses are generated for every bit, the recording performance and the transmission performance are degraded by half.

The other is a method of using a data pulse generated in accordance with "1" directly as a clock pulse, and then outputting a timing pulse between consecutive bits on and after the second bit when "0" comes consecutively. In this case, in order for detecting the data and the clock, it is required to perform sampling at a double frequency when retrieving the data.

However, since it is not achievable for the two methods described above to raise the transmission density, as a method of improving the circumstance there is known a standard such as Run Length Limited (RLL) 2.7, RLL 1.7, Eight to Fourteen Modulation (EFM), 8-16 modulation as described in JP-A-8-154053. These standards each relate to a method of detecting a changing point (an edge) between "1" and "0" thus modulated as described above on the retrieving side, and generating the clock using a Phase Locked Loop (PLL) or the like, and thus the transmission density can be raised.

However, according to such a method, since it is required to perform the modulation on the data afterward and limit consecutive appearance of "0" or "1," it is necessary to provide redundancy of 50% through 100% to the data expressed in a protocol 80A of a normal state as shown in FIG. 4 in order for providing the changing point of the bit value. For example, as shown in a communication protocol 80C added with redundancy, since the length of the data is elongated from 40 bits to 56 bits, an amount of data is increased, and improvement of the transmission density is inhibited.

SUMMARY

The invention is for solving at least a part of the problem described above, and can be realized as the following embodiments or aspects.

According to an aspect of the invention, there is provided a communication method including the steps of (a) dividing one bit data group into a plurality of bit groups, the one bit data group being taken out from a plurality of bit data groups defined by a communication protocol for transmitting predetermined information, and exerting no substantial influence on the predetermined information even when arbitrarily inverting a value of the bit, (b) determining whether or not the values of the bits constituting the bit group are all the same by each of the plurality of bit groups divided into in step (a), (c) inverting at least one of the values of the bits of the bit group determined in step (b) that the values of the bits are all the same, and (d) arranging the plurality of bit groups, each of which has at least one of the values of the bits inverted in step (c), in the plurality of bit data groups except the one bit data group at regular intervals.

According to the method described above, one bit data group is divided into a plurality of bit groups, the one bit data group being taken out from a plurality of bit data groups defined by a communication protocol, and exerting no substantial influence on the predetermined information to be transmitted even when arbitrarily inverting a value of the bit, at least one of the values of the bits of the bit group having the values of the bits the same as each other is inverted, and the plurality of bit groups are disposed in the plurality of bit data groups except the one bit data group at regular intervals. Therefore, since the bit groups each having the different values of the bits constituting the bit group, and having at least one value of one bit different from the value of the other bit are arranged in the plurality of bit data groups at regular intervals, the same values are not arranged consecutively in the plurality of bit data groups, and therefore, it becomes possible to provide the changing point at which the value of the bit is changed to the plurality of bit data groups without adding redundancy, thus improvement of the transmission density of communication can be achieved.

Further, according to another aspect of the invention, in the communication method of the above aspect of the invention, it is preferable that there is further provided the step of (e) disposing two bit groups at a predetermined position in the plurality of bit groups in accordance with the communication protocol, the two bit groups being formed by combining the plurality of bit groups taken out from the plurality of bit data groups having the plurality of bit groups arranged at regular intervals.

According to the method described above, a plurality of bit groups are combined from the plurality of bit data groups having the plurality of bit groups arranged at regular intervals, thereby restoring the bit data groups compliant to the communication protocol.

Further, according to another aspect of the invention, there is provided a communication system having a first communication device including a dividing section adapted to divide one bit data group into a plurality of bit groups, the one bit data group being taken out from a plurality of bit data groups defined by a communication protocol for transmitting predetermined information, and exerting no substantial influence on the predetermined information even when arbitrarily inverting a value of the bit, a determination section adapted to determine whether or not the values of the bits constituting the bit group are all the same by each of the plurality of bit groups divided into by the dividing section, a changing section adapted to invert at least one of the values of the bits of the bit group determined by the determination section that the values of the bits are all the same, and a sorting section adapted to arrange the plurality of bit groups, each of which has at least one of the values of the bits inverted by the changing section, in the plurality of bit data groups except the one bit data group at regular intervals, and a second communication device adapted to communicate with the first communication device and including a restoring section adapted to dispose two bit groups at a predetermined position in the plurality of bit groups in accordance with the communication protocol, the two bit groups being formed by combining the plurality of bit groups taken out from the plurality of bit data groups having the plurality of bit groups arranged at regular intervals.

According to the configuration described above, in the first communication device, one bit data group is divided into a plurality of bit groups, the one bit data group being taken out from a plurality of bit data groups defined by a communication protocol, and exerting no substantial influence on the predetermined information to be transmitted even when arbitrarily inverting a value of the bit, at least one of the values of the bits of the bit group having the values of the bits the same as each other is inverted, and the plurality of bit groups are disposed in the plurality of bit data groups except the one bit data group at regular intervals. Further, in the second communication device, a plurality of bit groups are combined from the plurality of bit data groups having the plurality of bit groups arranged at regular intervals, thereby restoring the bit data groups compliant to the communication protocol. Therefore, since the bit groups each having the different values of the bits constituting the bit group, and having at least one value of one bit different from the value of the other bit are arranged in the plurality of bit data groups at regular intervals, and the communication is performed in the condition in which the same values are not arranged consecutively in the plurality of bit data groups, it becomes possible to provide the changing point at which the value of the bit is changed to the plurality of bit data groups, thus improvement of the transmission density of communication can be achieved.

BRIEF DESCRIPTION OF THE DRAWINGS

The invention will be described with reference to the accompanying drawings, wherein like numbers reference like elements.

DESCRIPTION OF AN EXEMPLARY EMBODIMENT

Hereinafter, a communication device used in a communication system will be explained with reference to the accompanying drawings.

Embodiment

Figure 1:
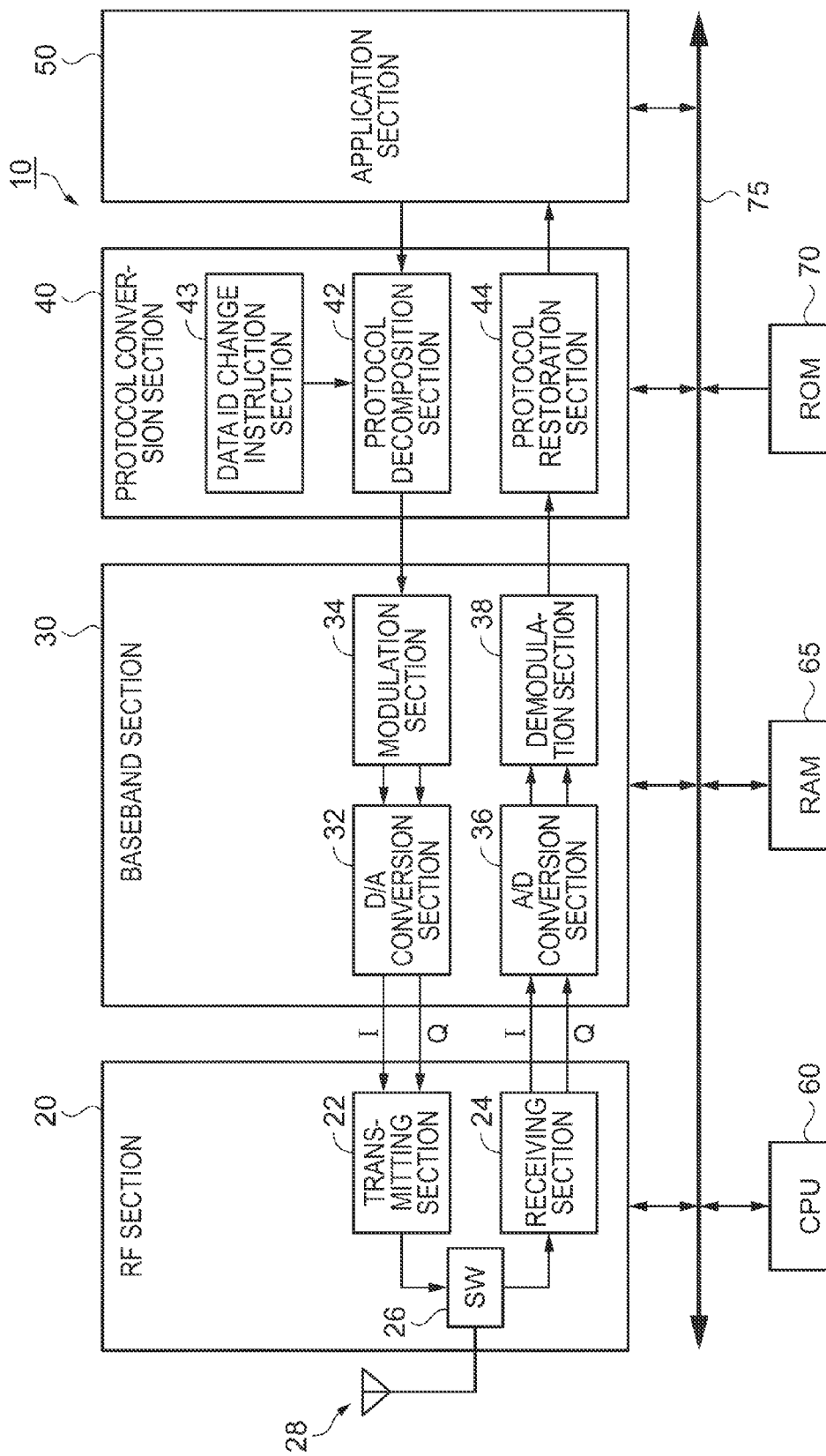
FIG. 1 is a block diagram showing a configuration of a communication device according to an embodiment of the invention.

FIG. 1 is a block diagram showing a configuration of a communication device 10 for transmitting and receiving digital data via a wireless communication facility. The communication device 10 is provided with an RF section 20, a baseband section 30, a protocol conversion section 40, and an application section 50, a central processing unit (CPU) 60, a random access memory (RAM) 65, and a read only memory (ROM) 70, and these constituents are connected to each other via a bus 75, which is a signal line for transmitting data, so as to be able to transmit and receive data with each other.

The RF section 20 is provided with an antenna section 28, a transmitting section 22, a receiving section 24, and a switch (SW) 26. Further, the baseband section 30 is provided with a D/A conversion section 32, a modulation section 34, an A/D conversion section 36, and a demodulation section 38. Further, the protocol conversion section 40 is provided with a protocol decomposition section 42, a data ID change instruction section 43, and a protocol restoration section 44.

The CPU 60 controls arithmetic operations and the entire device based on a control program. The ROM 70 previously stores the control program of the CPU 60 in a predetermined area thereof. The RAM 65 stores data retrieved from the ROM 70 and necessary calculation results in the arithmetic processing by the CPU 60. Further, the RF section 20, the baseband section 30, the protocol conversion section 40, and the application section 50 are configured by an electrical circuit not shown, and the respective functions are realized by the electrical circuit cooperating with software.

Then, the respective functions of the RF section 20, the baseband section 30, the protocol conversion section 40, and the application section 50 will be explained with reference also to FIG. 2.

The application section 50 generates digital data to be transmitted via the communication device 10, and at the same time, displays and records the digital data transmitted from another communication device 10. As such digital data, there are assumed, for example, multimedia information such as an image or a sound, or output data of a sensor or a measurement device. In the present embodiment, there are assumed transmission and reception of acceleration data measured by an acceleration sensor and gyro data measured by a gyro sensor.

Figure 2:
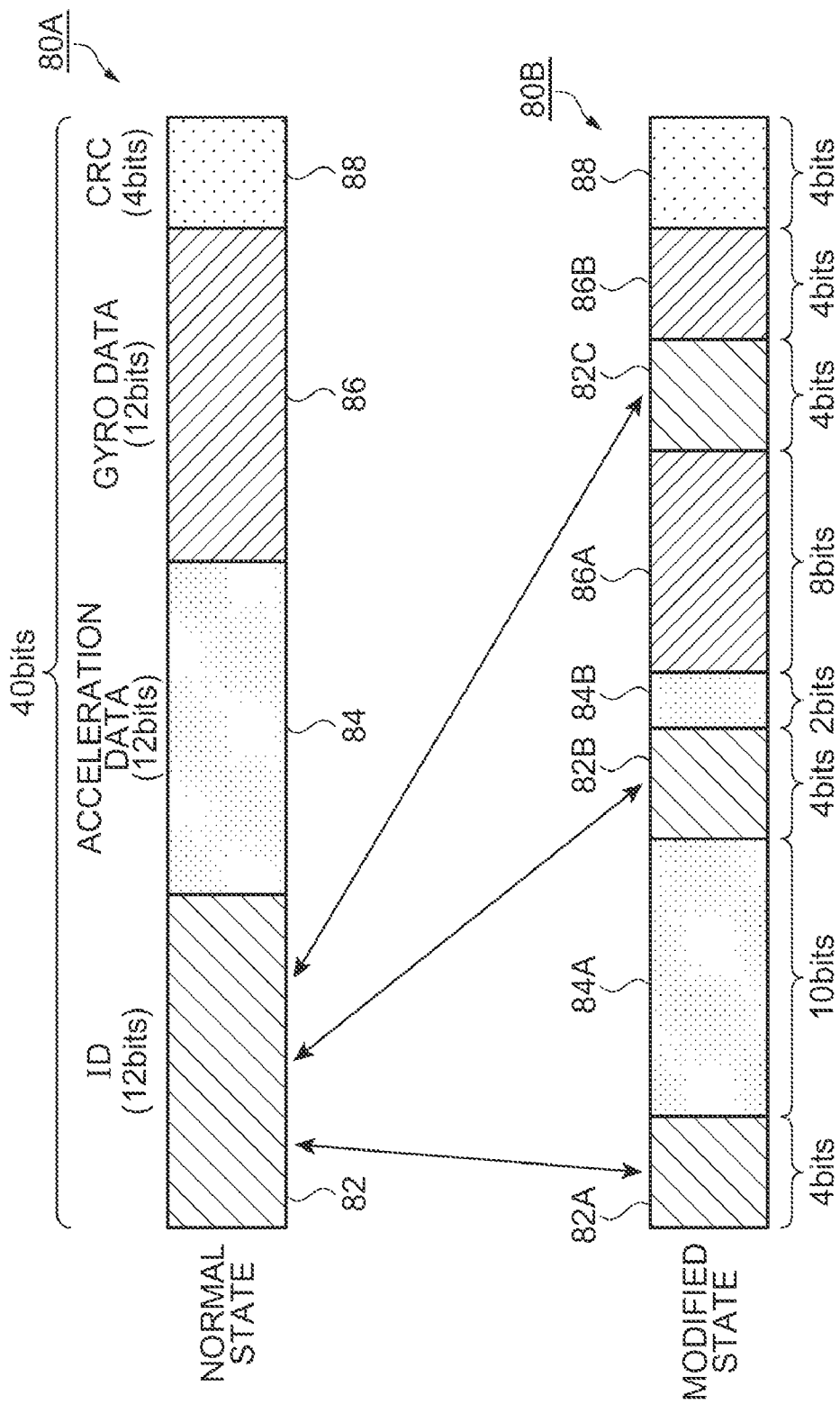
FIG. 2 is a diagram showing a sorting process of a communication protocol.

The digital data to be input and output by the application section 50 is compliant to a transmission protocol shown in FIG. 2. Here, a communication protocol 80A in a normal state includes a plurality of data areas (groups of bit data) defined for transmitting information related to the acceleration and the gyro sensor. For example, the beginning 12 bits correspond to an ID data area 82 for representing the data ID, and 12 successive bits correspond to an acceleration data area 84 representing information related to the acceleration. Further, 12 successive bits correspond to a gyro data area 86 representing information related to the gyro sensor, and the last 4 bits correspond to a CRC area 88 representing a Cyclic Redundancy Checksum (CRC).

Then, the protocol conversion section 40 will be explained. The protocol decomposition section 42 divides (a dividing section) a predetermined bit data group, which is included in a plurality of bit data groups transmitted from the application section 50 in a manner compliant to the communication protocol 80A in the normal state, into a plurality of areas (bit groups), thereby generating bit data group compliant to a communication protocol 80B in a modified state. It should be noted that the predetermined bit data group corresponds to data capable of arbitrarily inverting the bit value without exerting an influence on the information (the acceleration information and the gyro information) to be transmitted with respect to the value assigned by the application section 50. In the present embodiment, the data ID is adopted as such a bit data group, and the data ID of 12 bits is decomposed into bit groups of every 4 bits, namely into 3 nibbles (82A, 82B, and 82C). It should be noted that the number of bits of the bit groups obtained by the dividing operation is not limited to four.

In the communication protocol 80B, the first 4 bits from the beginning correspond to an ID data area 82A representing a part of the data ID, the 10 successive bits correspond to an acceleration data area 84A representing a part of the data related to the acceleration, and the 4 successive bits correspond to an ID data area 82B representing a part of the data ID. Further, the two successive bits correspond to an acceleration data area 84B representing the remainder of the data related to the acceleration, and the 8 further successive bits correspond to a gyro data area 86A representing the data related to the gyro sensor. The 4 successive bits correspond to an ID data area 82C representing a part of the remainder of the data ID, and further, the 4 successive bits correspond to a gyro data area 86B representing the remainder of the data related to the gyro sensor, and the last 4 bits correspond to the CRC area 88 representing the cyclic redundancy checksum (CRC). As a result, the three nibbles (82A, 82B, and 82C) are disposed at regular intervals.

In this case, the communication protocol 80A in the normal state and the communication protocol 80B in the modified state have the same data length of 40 bits. The data of the bit data group generated by the protocol decomposition section 42 is sequentially output to the baseband section 30. It should be noted that in the case in which communication is performed using a plurality of communication devices 10, the electro-magnetic wave to be transmitted or received is generated based on the baseband signal of the communication protocol 80B in the modified state.

The data ID change instruction section 43 monitors the data ID assigned by the application section 50, and if the bit values of at least one of the three nibbles (82A, 82B, and 82C) obtained by decomposing the data ID are all the same, namely if the value of the nibble is assigned to 0 (0000) or F (1111) in hexadecimal format, the data ID change instruction section 43 instructs the protocol decomposition section 42 to change the nibble assigned to 0 or F (a determination section). The protocol decomposition section 42, in response to the instruction for changing the nibble, inverts at least one bit value of the corresponding nibble to thereby change (a changing section) the value of the nibble to be a value other than 0 and F, and sorts (a sorting section) the bit data group compliant to the communication protocol 80B in the modified state. As a result, a limitation (RLL) that 0 or 1 does not appear consecutively beyond a predetermined length is applied to the data of the bit data group.

Figure 3:
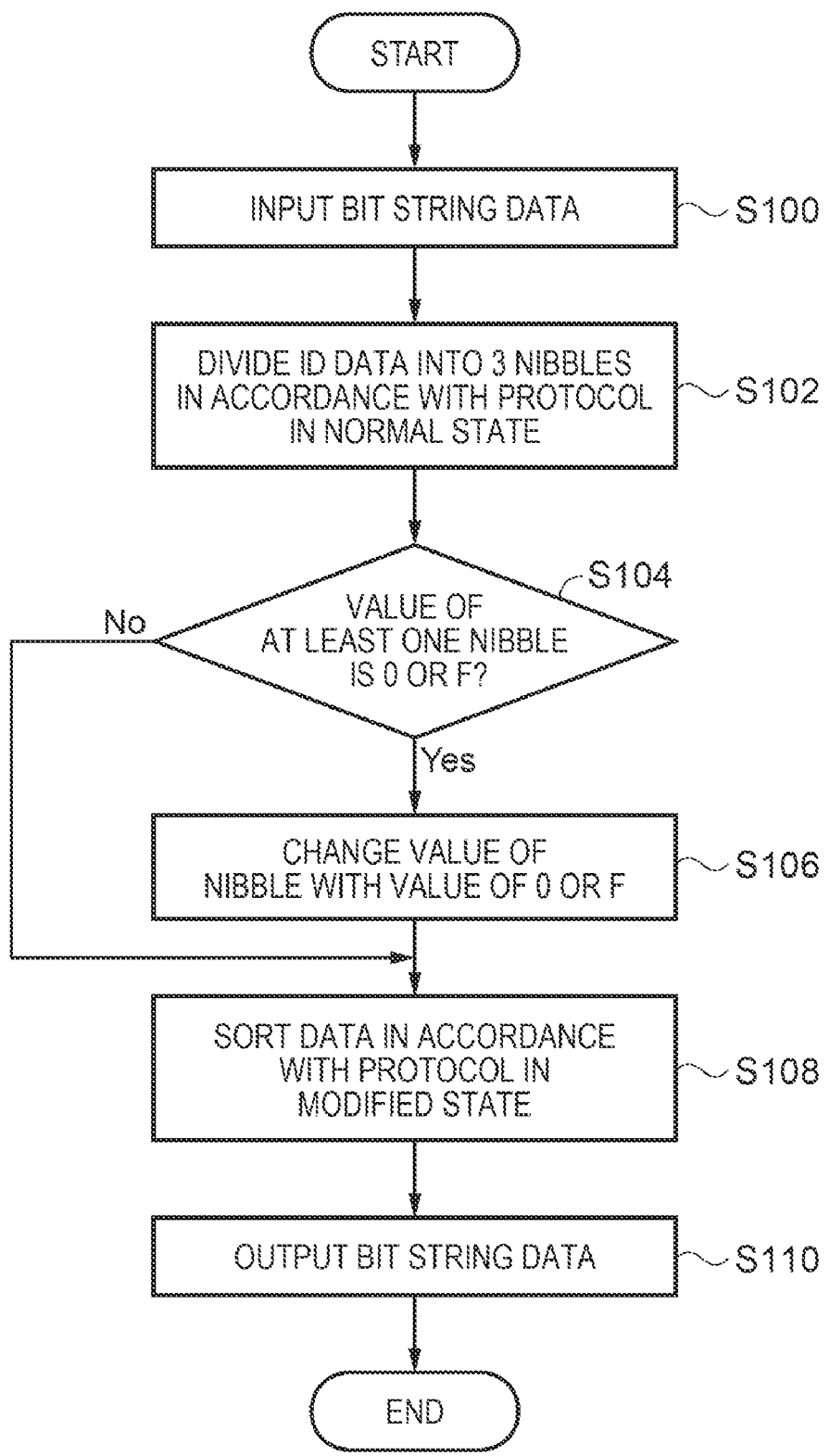
FIG. 3 is a flow chart showing a flow of a process executed in a protocol decomposition section and a data ID change instruction section.
Figure 4:
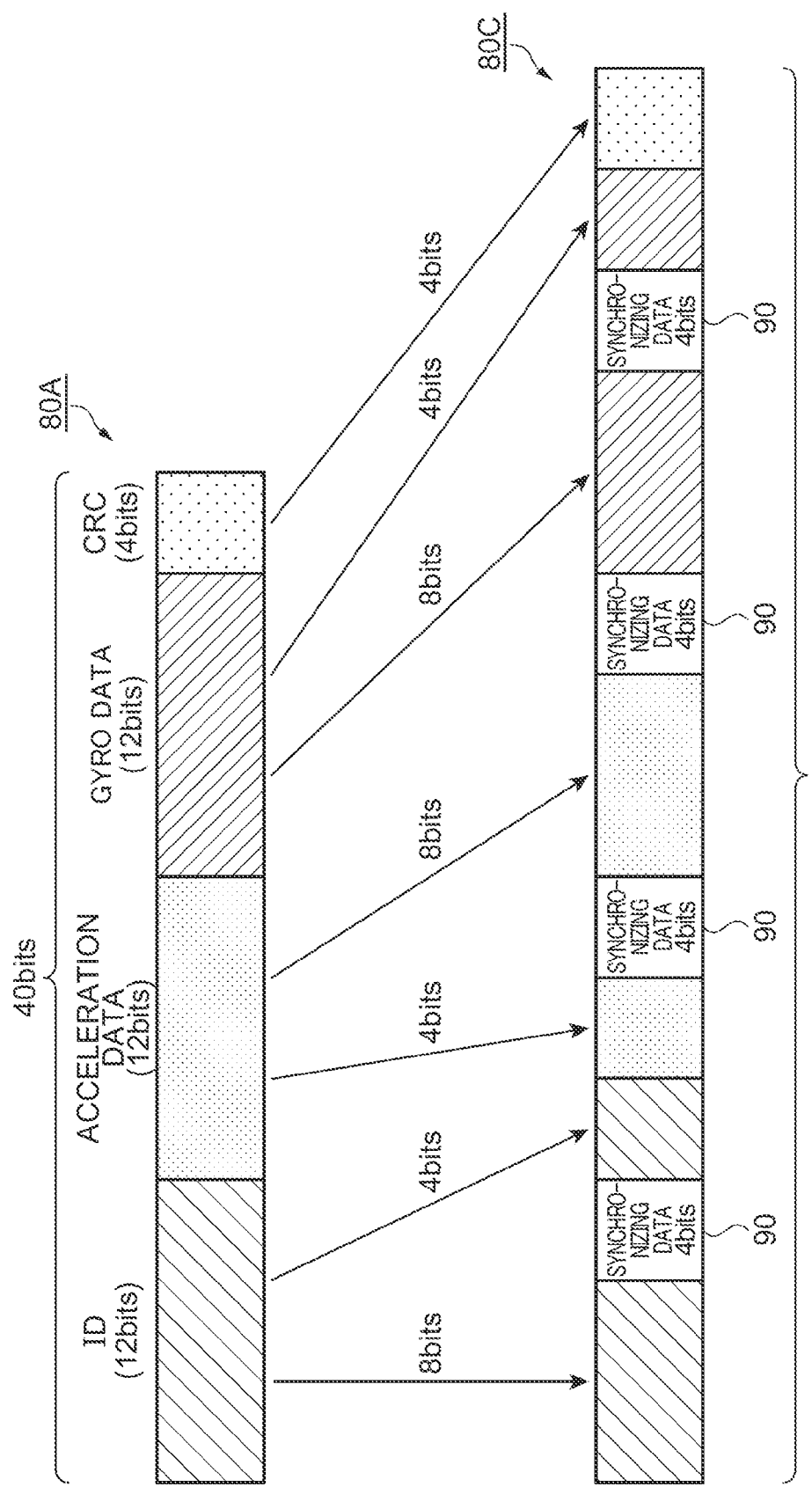
FIG. 4 is a diagram showing a communication protocol in the related art, to which redundancy is added.

Here, the flow of the process executed by the protocol decomposition section 42 and the data ID change instruction section 43 will be explained based on the flowchart shown in FIG. 3. Firstly, the bit string data of the bit data group compliant to the communication protocol 80A in the normal state is input sequentially from the application section 50 to the protocol decomposition section 42 (step S100).

Dividing Process

Then, the protocol decomposition section 42 decomposes the ID data area 82 of the bit string data thus input thereto into the three nibbles (82A, 82B, and 82C) each composed of 4 bits (step S102).

Determination Process

Then, the data ID change instruction section 43 determines whether or not the value of at least one of the three nibbles (82A, 82B, and 82C) is 0 or F (step S104).

Changing Process

Here, if it is determined that the value of at least one of the three nibbles (82A, 82B, and 82C) is 0 or F (Yes in the step S104), the data ID change instruction section 43 instructs (step S106) the protocol decomposition section 42 to change the value of the nibble to be a value other than 0 or F, and the process proceeds to the step S108.

On the other hand, if it is determined that the value of neither one of the nibbles is 0 or F (No in the step S104), the process proceeds to the step S108.

Sorting Process

In the step S108, the data ID change instruction section 43 sorts the bit string data in accordance with the communication protocol 80B in the modified state. Subsequently, the data ID change instruction section 43 sequentially outputs (step S110) the bit string data of the bit data group thus sorted to the baseband section 30, and then terminates the series of process. It should be noted that although in the present embodiment the value of the nibble having a value of 0 or F is changed and then sorted in accordance with the protocol in the modified state, it is also possible that the value of the nibble having a value of 0 or F is changed after it is sorted in accordance with the protocol in the modified state.

Going back to FIG. 1, the protocol restoration section 44 is a restoring section for restoring the bit data group transmitted from the baseband section 30 in accordance with the communication protocol 80B in the modified state into the bit data group compliant to the communication protocol 80A in the normal state. In the present embodiment, the restoration is performed (a restoration process) by taking out the bit groups of every 4 bits included in the communication protocol 80B, namely the three nibbles (82A, 82B, and 82C), and then integrating them to thereby generate the ID data area 82, and then disposing the ID data area 82 in front of the acceleration data area 84. The bit data group thus restored and compliant to the communication protocol 80A in the normal state is output to the application section 50.

Then, the function of the baseband section 30 will be explained. The baseband section 30 performs modulation and demodulation on the baseband signal and the data of the bit data group to thereby perform mutual conversion. The D/A conversion section 32 converts the digital signal into the baseband signal in an analog format. Further, the A/D conversion section 36 converts the baseband signal in an analog format into the digital signal.

The modulation section 34 maps data of the bit data group transmitted from the protocol conversion section 40 on the signal points of the signal expressed by the amplitude and the phase, and transmits two digital signals (an I signal and a Q signal) representing the signal points thus mapped to the D/A conversion section 32. Further, the demodulation section 38 restores the data of the bit data group from the signal points corresponding to the two digital signals (the I signal and the Q signal), and then transmits the data of the bit data group thus restored to the protocol conversion section 40. In this case, in either of the modulation section 34 and the demodulation section 38, since the data of the bit data group is sorted by the protocol decomposition section 42 of the communication device 10 on the counterpart of the communication so that 0 or 1 does not appear consecutively throughout the predetermined length, it is possible for a PLL or a synthesizer to detect the changing point between 0 and 1 to thereby generate the clock. It should be noted that the method of modulation and demodulation is not particularly limited, but BPSK method, QPSK method, 16-value QAM, and so on can also be adopted.

Then, the function of the RF section 20 will be explained. The RF section 20 modulates the baseband signal into a radio in a predetermined frequency band in the transmission operation, and demodulates the radio wave in a predetermined frequency band into the baseband signal in the receiving operation. The antenna section 28 performs mutual conversion between the electrical signal and the electro-magnetic wave (radio wave). More specifically, the antenna section 28 is manufactured so that a high gain can be obtained with respect to the radio wave in the predetermined frequency band, converts the transmission signal transmitted from the transmitting section 22 into a radio wave to thereby transmit it in the air, and at the same time receives the radio wave transmitted in the air by another communication device 10, and then converts the radio wave thus received into the received signal and transmits it to the receiving section 24.

The SW 26 operates in response to a control signal from the CPU 60 so as to output the received signal from the antenna section 28 to the receiving section 24 when receiving the radio wave from the antenna section 28, and to output the transmission signal from the transmitting section 22 to the antenna section 28 when transmitting the radio wave from the antenna section 28.

The receiving section 24 converts the radio frequency signal of the received signal transmitted from the antenna section 28 into the two baseband signals (the I signal and the Q signal) having phases perpendicular to each other. Further, the transmitting section 22 generates the transmission signal having the two baseband signals (the I signal and the Q signal) transmitted from the baseband section 30 as the radio frequency signal, and then transmits it to the antenna section 28. It should be noted that the transmission/reception system can be a superheterodyne system or a direct conversion system. Further, although not shown in the drawings, it is also possible to dispose a radio frequency filter for eliminating an interference wave between the antenna section 28 and the SW 26, and to dispose a low-pass filter for shaping the waveform between the RF section 20 and the baseband section 30.

By putting a plurality of communication devices 10 described hereinabove into practice and performing mutual transmission and reception as a communication system, reliability of communication can be improved without requiring a redundancy adding section for the communication data and without increasing the amount of information of communication. Further, since the amount of information of communication does not increase, the mutual communication time can be reduced, thus reduction of the respective communication devices 10 can be achieved.

Although the embodiment of the invention is described hereinabove with reference to the accompanying drawings, the specific configuration is not limited to the embodiment described above, but design change within the scope or the spirit of the invention is also included therein. For example, the communication device 10 capable of mutual transmission/reception is not a limitation, but a one-way communication system composed of two devices, namely a transmission device having the transmission function of the communication device 10 and a receiving device having the receiving function of the communication device 10, can also be adopted. Further, it is also possible to arrange the data to be divided between the communication devices 10 upon performing communication.

Japanese Patent Application No. 2009-094645 filed on Apr. 9, 2009, is hereby incorporated by reference in its entirety.

What is claimed is:

1. A communication method comprising:
  (a) dividing, in a communication device, one bit data group into a plurality of bit groups, the one bit data group being taken out from a plurality of bit data groups defined by a communication protocol for transmitting predetermined information, wherein inverting a value of a bit in the one bit data group modifies a representation of the information in the one bit data group without exerting an influence on the predetermined information;
  (b) determining whether or not the values of the bits are all the same in each bit of the bit data group of the plurality of bit groups divided into in step (a);
  (c) inverting at least one of the values of the bits of the bit group determined in step (b) that the values of the bits are all the same; and
  (d) arranging the plurality of bit groups, each of which has at least one of the values of the bits inverted in step (c), in the plurality of bit data groups except the one bit data group at regular intervals.

2. The communication method according to claim 1, further comprising:
  (e) disposing two bit groups at a predetermined position in the plurality of bit groups in accordance with the communication protocol, the two bit groups being formed by combining the plurality of bit groups taken out from the plurality of bit data groups having the plurality of bit groups arranged at regular intervals.

3. The communication method according to claim 1, wherein the predetermined information is one of multimedia information of an image, multimedia information of a sound, output data of a sensor, or output data of measurement devices.

4. The communication method according to claim 3, wherein the predetermined information is one of acceleration data from an acceleration sensor, or gyro data from a gyro sensor.

5. The communication method according to claim 1, wherein the one bit data group corresponds to an ID data area of the communication protocol.

6. The communication method according to claim 1, wherein the plurality of bit groups arranged in the plurality of bit data groups except the one bit data group at regular intervals is used to generate a clock signal.

7. A communication system comprising:
  a first communication device including
    a dividing section that divides one bit data group into a plurality of bit groups, the one bit data group being taken out from a plurality of bit data groups defined by a communication protocol for transmitting predetermined information, wherein inverting a value of a bit in the one bit data group modifies a representation of the information in the one bit data group without exerting an influence on the predetermined information,
    a determination section that determines whether or not the values of the bits are all the same in each bit of the bit data group of the plurality of bit groups divided into by the dividing section,
    a changing section that inverts at least one of the values of the bits of the bit group determined by the determination section that the values of the bits are all the same, and
    a sorting section that arranges the plurality of bit groups, each of which has at least one of the values of the bits inverted by the changing section, in the plurality of bit data groups except the one bit data group at regular intervals; and
  a second communication device that communicates with the first communication device, including
    a restoring section that disposes two bit groups at a predetermined position in the plurality of bit groups in accordance with the communication protocol, the two bit groups being formed by combining the plurality of bit groups taken out from the plurality of bit data groups having the plurality of bit groups arranged at regular intervals.

8. The communication system according to claim 7, wherein the predetermined information is one of multimedia information of an image, multimedia information of a sound, output data of a sensor, or output data of measurement devices.

9. The communication system according to claim 8, wherein the predetermined information is one of acceleration data from an acceleration sensor, or gyro data from a gyro sensor.

10. The communication system according to claim 7, wherein the one bit data group corresponds to an ID data area of the communication protocol.

11. The communication system according to claim 7, wherein the second communication device generates a clock signal using the plurality of bit groups arranged in the plurality of bit data groups except the one bit data group at regular intervals.

* * * * *